US009257536B2

(12) United States Patent
Adam et al.

(10) Patent No.: US 9,257,536 B2
(45) Date of Patent: Feb. 9, 2016

(54) FINFET WITH CRYSTALLINE INSULATOR

(71) Applicant: GLOBALFOUNDRIES Inc., Grand Cayman (KY)

(72) Inventors: Thomas N. Adam, Slingerlands, NY (US); Kangguo Cheng, Schenectady, NY (US); Ali Khakifirooz, Mountain View, CA (US); Alexander Reznicek, Troy, NY (US); Raghavasimhan Sreenivasan, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 129 days.

(21) Appl. No.: 13/867,247

(22) Filed: Apr. 22, 2013

(65) Prior Publication Data
US 2014/0312425 A1   Oct. 23, 2014

(51) Int. Cl.
*H01L 29/66* (2006.01)
(52) U.S. Cl.
CPC ................. *H01L 29/66795* (2013.01)
(58) Field of Classification Search
CPC ................. H01L 29/785; H01L 29/66795
IPC ................. H01L 29/785, 29/66795
See application file for complete search history.

(56) References Cited

U.S. PATENT DOCUMENTS

| 6,610,548 | B1 | 8/2003 | Ami et al. |
| 6,852,575 | B2 | 2/2005 | Bojarczuk, Jr. et al. |
| 7,135,699 | B1 | 11/2006 | Atanackovic |
| 7,879,660 | B2 | 2/2011 | Booth, Jr. et al. |
| 8,080,838 | B2 | 12/2011 | Chang et al. |
| 8,222,680 | B2 | 7/2012 | Lin et al. |
| 8,237,226 | B2 | 8/2012 | Okano |
| 8,263,451 | B2 | 9/2012 | Su et al. |
| 2003/0008520 | A1* | 1/2003 | Bojarczuk et al. ............ 438/752 |
| 2009/0236595 | A1* | 9/2009 | Atanackovic .................... 257/43 |
| 2011/0042744 | A1* | 2/2011 | Cheng et al. .................. 257/347 |
| 2011/0101455 | A1 | 5/2011 | Basker et al. |
| 2011/0298058 | A1 | 12/2011 | Kawasaki et al. |
| 2012/0190179 | A1 | 7/2012 | Basker et al. |

* cited by examiner

*Primary Examiner* — Ermias Woldegeorgis
(74) *Attorney, Agent, or Firm* — Heslin Rothenberg Farley & Mesiti, P.C.

(57) ABSTRACT

FinFET structures and methods of formation are disclosed. Fins are formed on a bulk substrate. A crystalline insulator layer is formed on the bulk substrate with the fins sticking out of the epitaxial oxide layer. A gate is formed around the fins protruding from the crystalline insulator layer. An epitaxially grown semiconductor region is formed in the source drain region by merging the fins on the crystalline insulator layer to form a fin merging region.

9 Claims, 5 Drawing Sheets

FINFET WITH CRYSTALLINE INSULATOR

FIELD OF THE INVENTION

The present invention relates generally to semiconductor fabrication, and more particularly to a fin field effect transistor (finFET) and method of fabrication.

BACKGROUND OF THE INVENTION

With the continuing trend towards miniaturization of integrated circuits (ICs), there is a need for transistors to have higher drive currents with increasingly smaller dimensions. Fin field effect transistor (FinFET) technology is becoming more prevalent as device size continues to shrink. It is therefore desirable to have improved finFET devices and methods of fabrication.

SUMMARY OF THE INVENTION

In one embodiment, a semiconductor structure is provided. The semiconductor structure comprises a semiconductor substrate, comprising a plurality of fins formed thereon, a gate disposed on the plurality of fins, a crystalline dielectric region disposed on the semiconductor substrate, and an epitaxial semiconductor region disposed on the crystalline dielectric region.

In another embodiment, a method of forming a semiconductor structure is provided. The method comprises forming a plurality of fins in a semiconductor substrate, forming a crystalline insulator layer on the semiconductor substrate, forming a gate on the semiconductor substrate, and forming an epitaxial semiconductor region on the crystalline insulator layer, wherein the epitaxial semiconductor region is in direct physical contact with the plurality of fins.

In another embodiment, a method of forming a semiconductor structure is provided. The method comprises forming a plurality of fins in a semiconductor substrate, forming a crystalline insulator layer on the semiconductor substrate, forming a gate on the semiconductor substrate, and forming an epitaxial semiconductor region on the crystalline insulator layer, wherein the epitaxial semiconductor region is in direct physical contact with the plurality of fins, and wherein the epitaxial semiconductor region is formed with a faceted side facing the gate.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1:
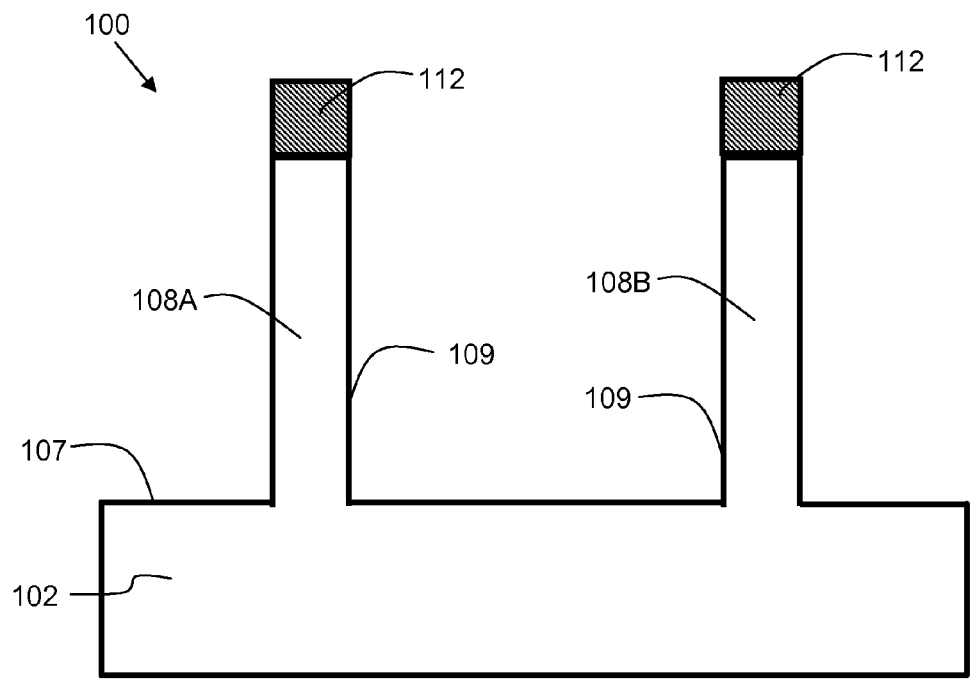

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

FIG. 1 is a semiconductor structure at a starting point for embodiments of the present invention.

Figure 2:
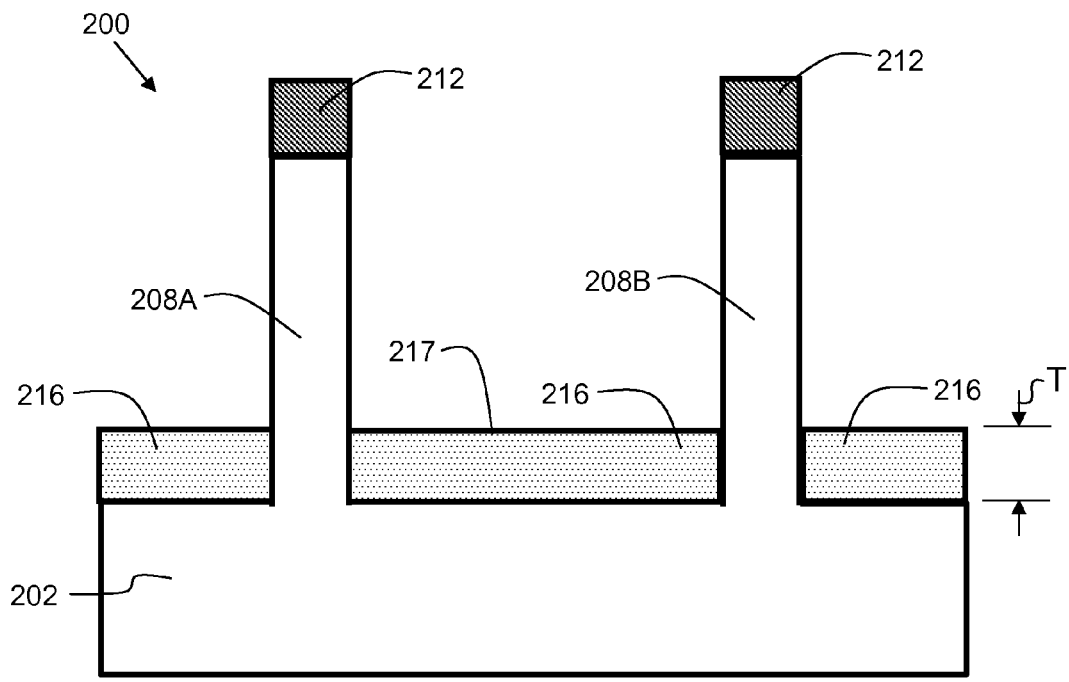

FIG. 2 is a semiconductor structure after a subsequent process step of forming a crystalline insulator.

Figure 3:
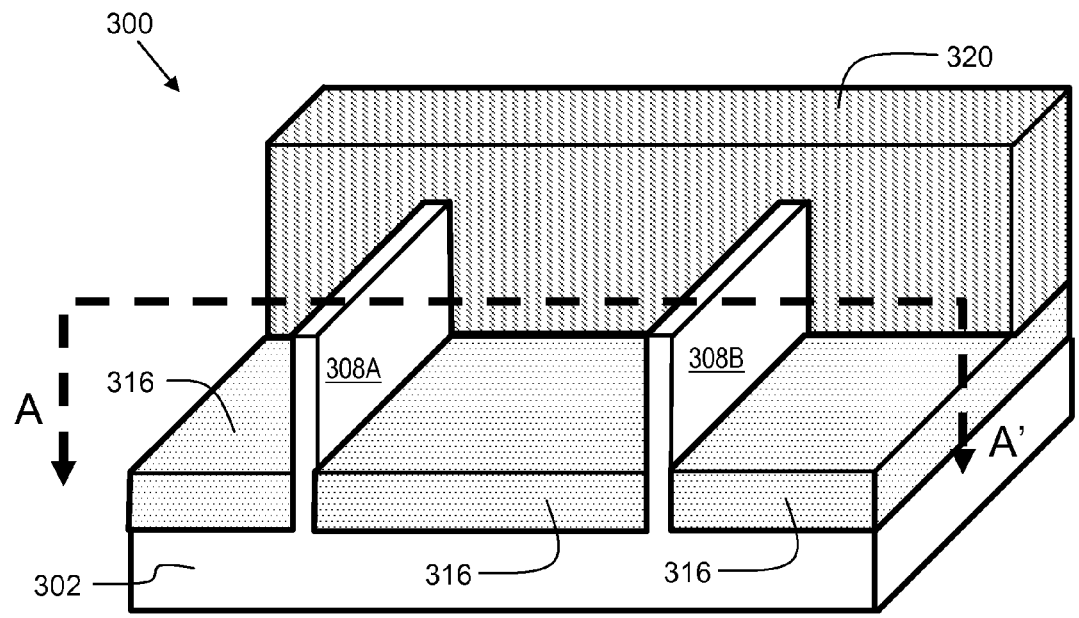

FIG. 3 is a semiconductor structure after a subsequent process step of forming a gate.

Figure 4:
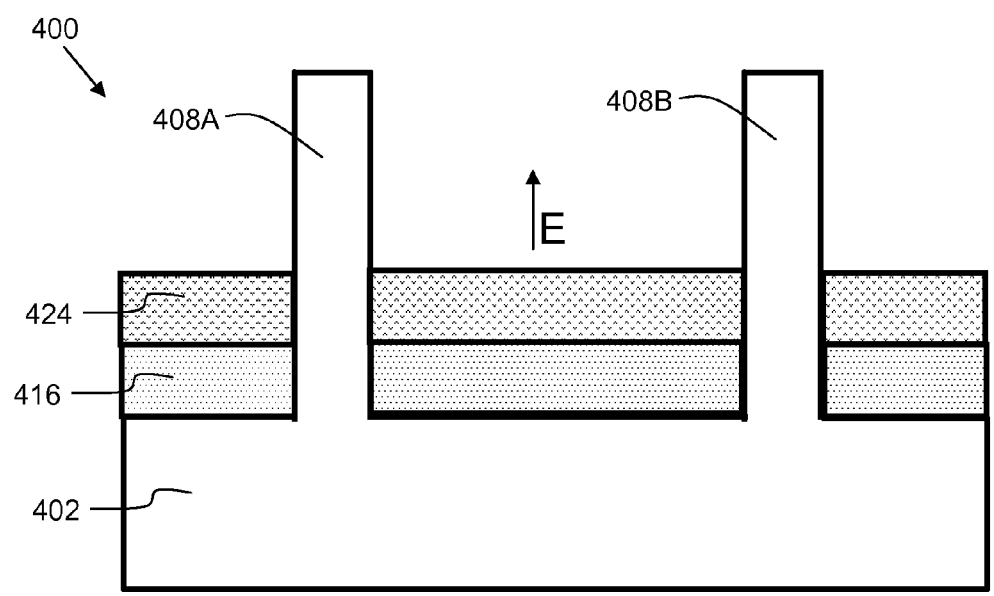

FIG. 4 is a semiconductor structure during the process step of forming an epitaxial semiconductor region.

Figure 5:
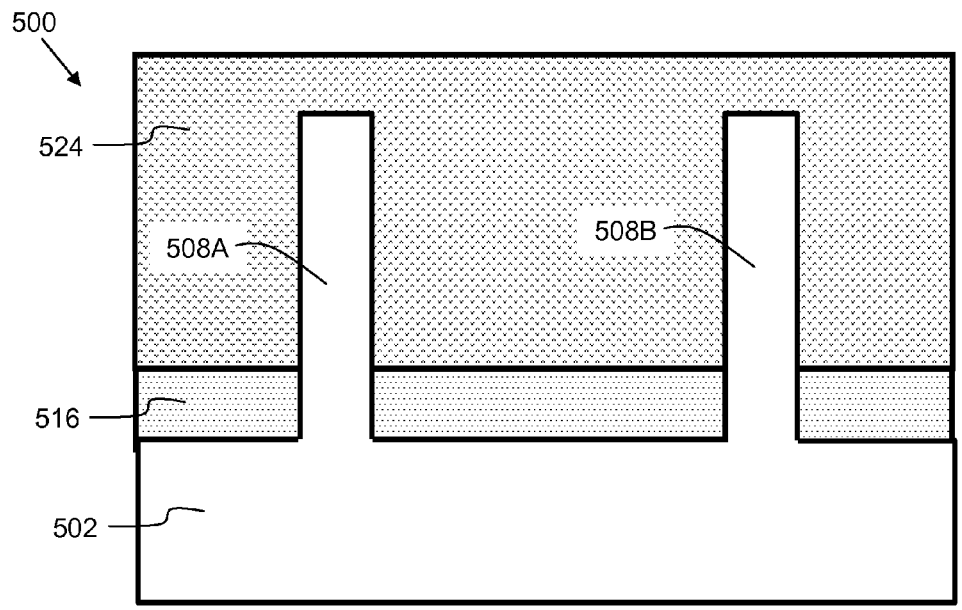

FIG. 5 is a semiconductor structure after the process step of forming an epitaxial semiconductor region.

Figure 6:
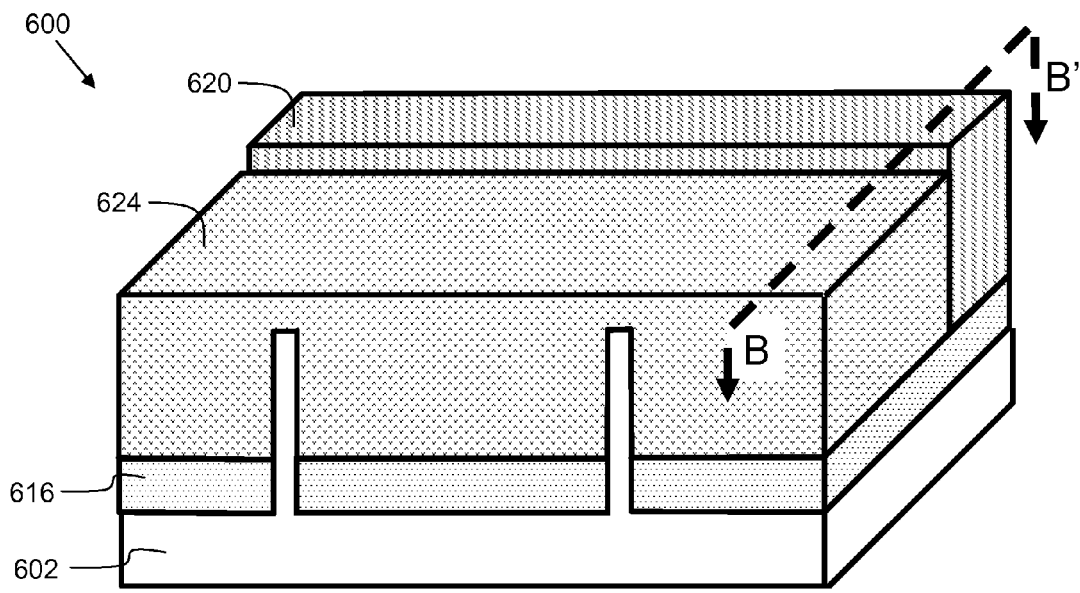

FIG. 6 is a perspective view of the embodiment of FIG. 5.

Figure 7:
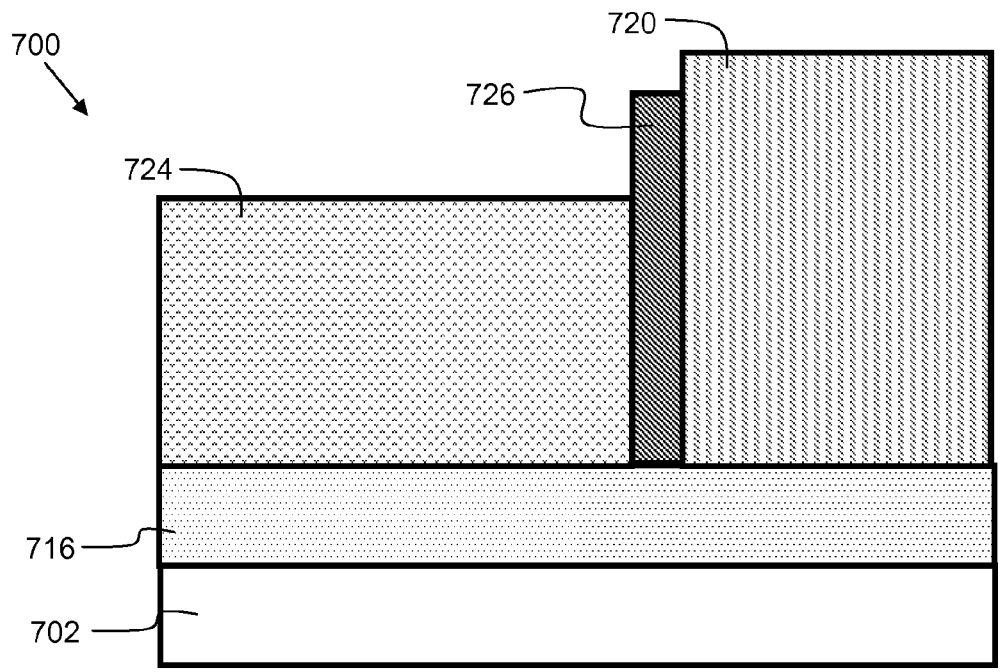

FIG. 7 is a side view of the embodiment of FIG. 6.

Figure 8:
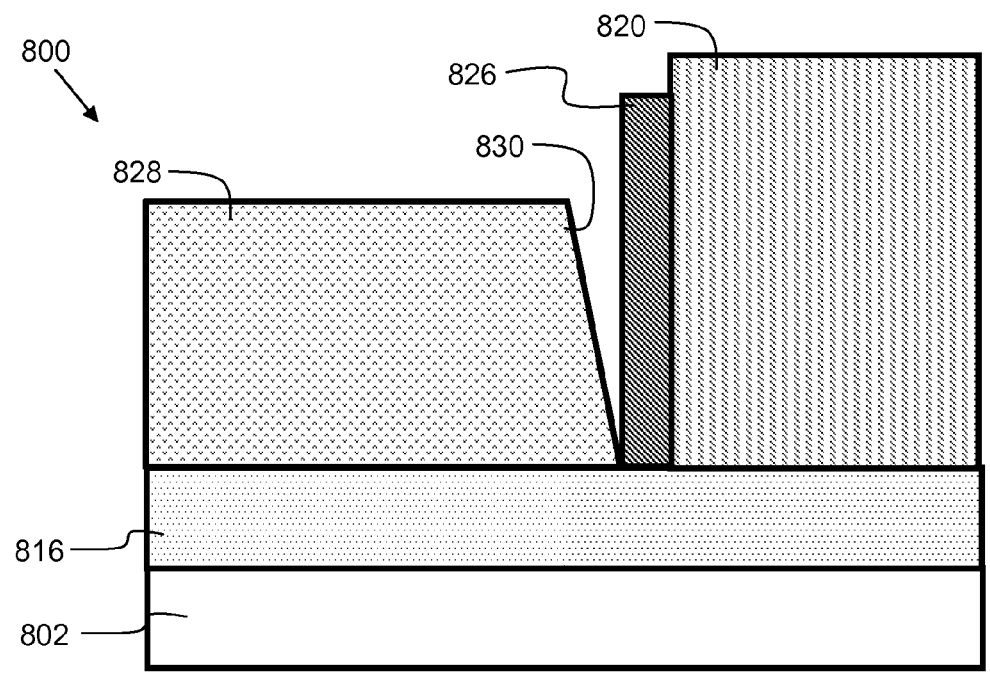

FIG. 8 is a side view of an alternative embodiment including a faceted epitaxial semiconductor region.

Figure 9:
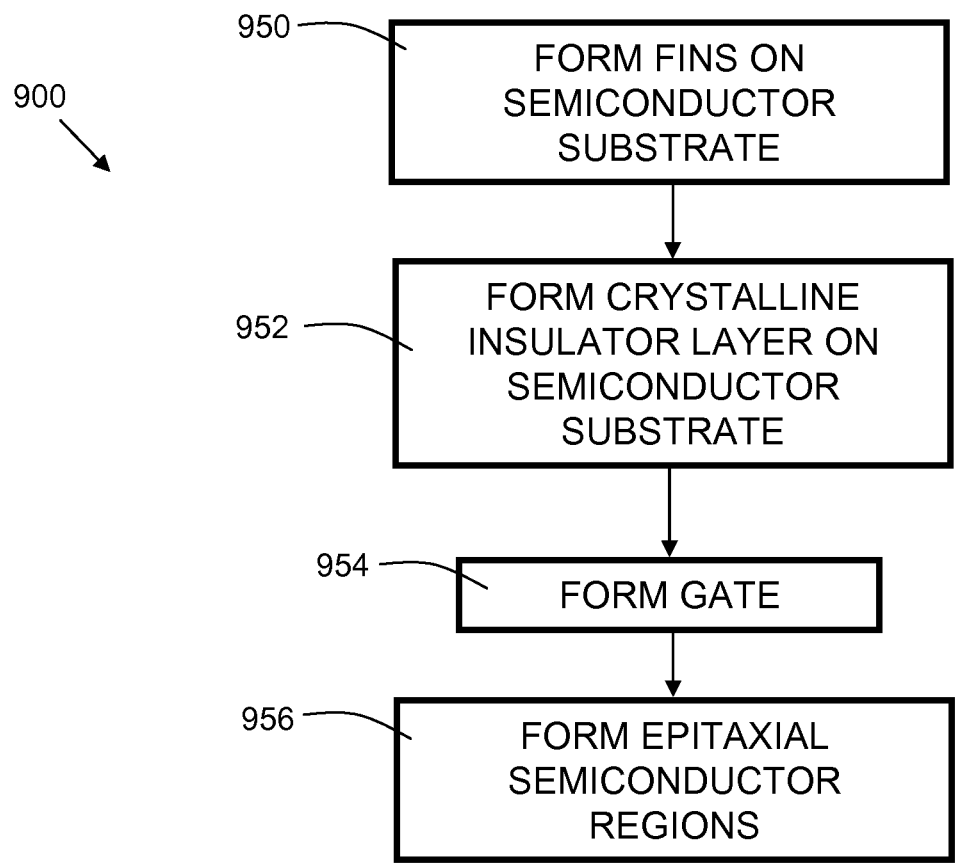

FIG. 9 is a flowchart indicating process steps for embodiments of the present invention.

DETAILED DESCRIPTION

In the fabrication of semiconductor devices, including finFETs, product yield and device variability are of paramount concern. In many finFETs, multiple fins are "merged" by having a semiconductor region contact a group of fins. Prior art fin merging processes are difficult to control, leading to non-uniformity of the epitaxial semiconductor region used for merging. This non-uniformity leads to reduced product yield and increased device variability. Other problems, such as excessive leakage and punch-through may also occur.

Embodiments of the present invention utilize a crystalline insulator layer below the fin merging layer. The crystalline insulator layer serves as a template for fin merging epitaxy which allows steady, even growth from the bottom up. The result is a source/drain epitaxial semiconductor region without voids and defects, serving to reduce parasitic capacitances and punch-through. Furthermore, the height of the epitaxial semiconductor region is easily controllable.

FIG. 1 is a semiconductor structure 100 at a starting point for embodiments of the present invention. A bulk semiconductor substrate 102 forms the base of semiconductor structure 100. Substrate 102 may be made from any now known or later developed semiconductor materials including but not limited to, for example, silicon, germanium, silicon-germanium alloy, silicon carbide, and compound (e.g. III-V and II-VI) semiconductor materials. Non-limiting examples of compound semiconductor materials include gallium arsenide, indium arsenide, and indium phosphide. Typically substrate 102 may be about, but is not limited to, several hundred microns in thickness. For example, substrate 102 may include a thickness ranging from about 0.5 millimeter (mm) to about 1.5 mm. In some embodiments, substrate 102 may consist essentially of one or more Group III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Substrate 102 may also be comprised of Group II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

Using industry-standard techniques (such as recessing), fins 108A and 108B are formed in the bulk substrate 102. A pad nitride layer 112 may be disposed on top of the fins. The pad nitride layer 112 may be blanket deposited on the substrate 102 prior to formation of the fins. Substrate 102 has a base surface 107. The fins (108A and 108B) have a sidewall 109. In embodiments, the sidewalls 109 have a crystalline structure of (110). Other embodiments, using a substrate 102 with a different crystalline structure, may comprise substrates having a crystalline structure of (110) with fin sidewalls 109 having a crystalline structure of (100).

FIG. 2 is a semiconductor structure 200 after a subsequent process step of forming a crystalline insulator (dielectric) 216 on the base surface (107 of FIG. 1) of substrate 202. As stated previously, similar elements may be referred to by similar numbers in various figures (FIGs) of the drawing, in which case typically the last two significant digits may be the same. For example, bulk substrate 202 of FIG. 2 is similar to bulk substrate 102 of FIG. 1. In embodiments of the present invention, crystalline insulator 216 may have a (100) crystalline structure on its top surface 217. The crystalline insulator 216 may be an epitaxial oxide. In some embodiments, the epitaxial oxide is of a rare-earth variety. In some embodiments, crystalline insulator (dielectric layer) 216 (e.g., a crystalline oxide, back-gate dielectric layer, etc.) may be disposed on substrate 202. Crystalline dielectric layer 216 may be formed of an epitaxial oxide. In an embodiment, crystalline dielectric layer 216 includes a rare earth oxide, such as cerium oxide ($CeO_2$), lanthanum oxide ($La_2O_3$), yttrium oxide ($Y_2O_3$), gadolinium oxide ($Gd_2O_3$), europium oxide ($Eu_2O_3$), or terbium oxide ($Tb_2O_3$). In one embodiment, crystalline dielectric layer 216 includes combinations of rare earth oxides (e.g., a material such as $ABO_3$, where 'A' and 'B' may be any rare earth metal (e.g., lanthanum scandium oxide ($LaScO_3$)) and may be epitaxially grown on substrate 202. In one embodiment, crystalline dielectric layer 216 may include Perovskites (e.g. strontium titanate ($SrTiO_3$) or barium titanate ($BaTiO_3$)). In yet another embodiment crystalline dielectric layer 216 may include aluminum oxide $Al_2O_3$ or aluminum oxide compounds (e.g., lanthanum aluminum $LaAlO_3$) which may be deposited by pulsed laser deposition (PLD). In an embodiment, crystalline dielectric layer 216 may be deposited on substrate 202 and may have a thickness 'T' of about 2 nanometers to about 500 nanometers. In one embodiment, crystalline dielectric layer 216 may have a thickness of about 10 nanometers to about 150 nanometers. In another embodiment, crystalline dielectric layer 216 may have a thickness 'T' of about 20 nanometers to about 50 nanometers. In other embodiments, crystalline insulator 216 may have a (110) crystalline structure on its top surface 217, with fin sidewalls having a crystalline structure of (100).

FIG. 3 is a semiconductor structure 300 after a subsequent process step of forming a gate 320 which is disposed on the fins 308A and 308B. The gate 320 may be oriented orthogonally to the fins 308A and 308B. The gate may be comprised of polysilicon, or may be a metal gate formed by a replacement metal gate (RMG) process. A gate dielectric layer (not shown) may also be present. The pad nitride layer (112 of FIG. 1) may be removed after gate formation. The gate also comprises a spacer disposed adjacent to it (shown in FIGS. 7 and 8).

FIG. 4 is a semiconductor structure 400, as viewed along line A-A' of FIG. 3, during the process step of forming an epitaxial semiconductor region 424. Since insulator layer 416 is a crystalline insulator layer, epitaxial growth which is mainly from the bottom-up (as indicated by arrow E) is possible, and results in a smooth top surface, without voids, divots, or other defects. In some embodiments, the epitaxial growth process may be tuned to have growth on both the sidewalls of the fins (208A, 208B) and the bottom. In other embodiments, the growth may be mainly on the sidewalls of the fins. In embodiments where the epitaxial growth is primarily bottom-up, then the crystalline structure of the insulator layer 416 is similar to that of the top surface of substrate 402. In some embodiments, epitaxial semiconductor region 424 comprises epitaxial silicon. In other embodiments, epi-taxial semiconductor region 424 comprises epitaxial silicon and germanium with boron doping (SiGe:B), or epitaxial silicon with carbon and phosphorous doping (Si:CP). The boron or phosphorous dopants may be added in-situ, during the epitaxial growth process. Carbon may be used as a stress inducer. In some embodiments, the carbon content may range form about 0.4% (2e20 atoms per cubic centimeter) to about 4% (2e21 atoms per cubic centimeter).

In some embodiments where SiGe is used, the germanium concentration ranges from about 10 percent to about 80 percent. In some embodiments, epitaxial semiconductor region 424 may be undoped. In other embodiments, epitaxial semiconductor region 424 may be doped. In some embodiments, the dopant concentration (e.g. for boron, phosphorous, or arsenic) of epitaxial semiconductor region 424 may range from about 5E19 atoms per cubic centimeter to about 1.5E21 atoms per cubic centimeter. In some embodiments, the dopant concentration of epitaxial semiconductor region 424 may range from about 2E20 atoms per cubic centimeter to about 1E21 atoms per cubic centimeter. In other embodiments, the dopant concentration of epitaxial semiconductor region 424 may range from about 4E20 atoms per cubic centimeter to about 7E20 atoms per cubic centimeter. The dopants may be introduced via in-situ doping.

Regarding epitaxial semiconductor region 424, besides silicon, other semiconductor materials such as germanium, silicon germanium, GeSn, III-V compound semiconductor, and/or II-VI compound semiconductor materials may also be included in epitaxial semiconductor region 424. In an embodiment, epitaxial semiconductor region 424 may be doped or un-doped and may include: silicon, germanium, silicon-germanium alloy, and/or carbon doped silicon (Si:C). In one embodiment, epitaxial (crystalline) semiconductor region 424 may include carbon doped silicon with an atomic carbon concentration of between about 0.2% to about 4.0% substitutional carbon. In one embodiment, epitaxial semiconductor region 424 may include a carbon doped silicon type material having a concentration of about 0.3% to about 2.5% substitutional carbon. It is understood that the total amount of carbon in epitaxial semiconductor region 424 may be higher than the substitutional amount. In a preferred exemplary embodiment, epitaxial semiconductor region 424 may include silicon, germanium, silicon germanium, carbon doped silicon, a silicon-germanium alloy, and compound (e.g. III-V and II-VI) semiconductor materials etc. In an embodiment, carbon doped silicon may include a concentration of substitutional carbon (C) of about 0.4 to about 2.5% Si:C.

FIG. 5 is a semiconductor structure 500 after the process step of forming an epitaxial semiconductor region. The epitaxial semiconductor region 524 is grown to a level such that it is above the tops of the fins 508A and 508B, and serves to merge fins 508A and 508B together. The epitaxial semiconductor region 524 may be recessed or etched back to achieve a desired height.

FIG. 6 is a semiconductor structure 600 shown in perspective view, which is similar to the embodiment of FIG. 5.

FIG. 7 is a semiconductor structure 700 which is similar to the embodiment of FIG. 6. FIG. 7 is shown in a side view along line B-B' of FIG. 6. As can be seen in this view, the epitaxial semiconductor region 724 is in contact with gate spacer 726, which is disposed between epitaxial semiconductor region 724 and gate 720. Gate spacer 726 may be comprised of nitride, and formed via a technique such as deposition of a conformal nitride layer, followed by removal of unneeded portions of the conformal nitride layer. The epitaxial semiconductor region 724 is then formed after formation of the gate spacer 726. Gate spacer 726 prevents direct physical contact between epitaxial semiconductor region 724 and gate 720, which serves to reduce leakage and parasitic capacitance.

FIG. 8 is a semiconductor structure 800 shown in a side view of an alternative embodiment including a faceted epitaxial semiconductor region 828. By controlling the epitaxy process conditions, faceted surface 830, which faces the gate 820, may be grown faceted (with an oblique angle) such that it grows away from gate 820 and reduces contact between semiconductor region 828 and gate 820. This growth may be achieved by using selective epitaxy in the highly selective regime. The overabundance of etchant gas under highly selective conditions leads to facetted epitaxial growth along the spacer.

FIG. 9 is a flowchart 900 indicating process steps for embodiments of the present invention. In process step 950, fins are formed on the semiconductor substrate (see 108A and 108B of FIG. 1). In process step 952, a crystalline insulator layer is formed on the semiconductor substrate (see 216 of FIG. 2). The crystalline insulator layer may be an epitaxially grown rare earth oxide having a top surface with a (100) crystalline structure. In process step 954 a gate is formed (see 320 of FIG. 3). In process step 956, epitaxial semiconductor regions are formed to merge the fins (see 524 of FIG. 5). In some embodiments, the epitaxial semiconductor regions are comprised of silicon, silicon Germanium alloy (SiGe), doped or undoped carbon doped silicon (Si:C or Si:CP, Si:As), phosphorus(arsenic) doped Si:P/As.

Embodiments of the present invention provide for methods and structures for forming a finFET. Fins are formed on a bulk substrate. A crystalline insulator layer is formed on the bulk substrate with the fins sticking out of the epitaxial oxide layer. A gate is formed around the fins protruding from the crystalline insulator layer. An epitaxially grown semiconductor region is formed in the source drain region by merging the fins on the crystalline insulator layer to form a fin merging region. The fin merging region has reduced defects and variability compared to that of the prior art, such as, for example, minimizing parasitic capacitances and punch-through.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A semiconductor structure comprising:
a semiconductor substrate, comprising a plurality of fins formed thereon;
a gate disposed on the plurality of fins;
a crystalline dielectric region disposed on the semiconductor substrate; and
an epitaxial semiconductor region disposed on the crystalline dielectric region, and wherein the epitaxial semiconductor region comprises a faceted surface which faces the gate, and wherein the epitaxial semiconductor region has non-faceted sidewall surfaces that are entirely parallel to a sidewall of each fin of the plurality of fins.

2. The semiconductor structure of claim 1, wherein the crystalline dielectric region comprises an epitaxial oxide.

3. The semiconductor structure of claim 2, wherein the crystalline dielectric region comprises a rare earth oxide.

4. The semiconductor structure of claim 3, wherein the rare earth oxide is selected from the group consisting of:
cerium oxide, lanthanum oxide, yttrium oxide, gadolinium oxide, europium oxide, and terbium oxide.

5. The semiconductor structure of claim 3, wherein the rare earth oxide comprises a top surface with a (100) crystalline structure, and wherein each fin of the plurality of fins comprises a (110) sidewall crystalline structure.

6. The semiconductor structure of claim 3, wherein the rare earth oxide comprises a top surface with a (110) crystalline structure, and wherein each fin of the plurality of fins comprises a (100) sidewall crystalline structure.

7. The semiconductor structure of claim 1, wherein the epitaxial semiconductor region comprises carbon doped silicon with an atomic carbon concentration of between about 0.2% to about 4.0% substitutional carbon.

8. The semiconductor structure of claim 1, wherein the epitaxial semiconductor region comprises a material selected from the group consisting of: n-doped silicon, p-doped silicon, and un-doped silicon.

9. The semiconductor structure of claim 1, wherein the epitaxial semiconductor region comprises silicon germanium, wherein the germanium concentration ranges from about 10 percent to about 80 percent.

* * * * *